United States Patent
Perner et al.

(10) Patent No.: US 6,456,524 B1
(45) Date of Patent: Sep. 24, 2002

(54) HYBRID RESISTIVE CROSS POINT MEMORY CELL ARRAYS AND METHODS OF MAKING THE SAME

(75) Inventors: Frederick A. Perner, Palo Alto; Lung Tran, Saratoga, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 10/000,636

(22) Filed: Oct. 31, 2001

(51) Int. Cl.$^7$ ................................................ G11C 11/00
(52) U.S. Cl. ........................................ 365/158; 365/148
(58) Field of Search ............................... 365/158, 148, 365/100, 171, 173, 175

(56) References Cited

U.S. PATENT DOCUMENTS

| | | |
|---|---|---|
| 6,185,143 B1 | 2/2001 | Perner et al. |
| 6,256,247 B1 | 7/2001 | Perner |
| 6,259,644 B1 | 7/2001 | Tran et al. |
| 6,356,477 B1 * | 3/2002 | Tran .......................... 365/158 |
| 2001/0012228 A1 | 8/2001 | Perner |

* cited by examiner

Primary Examiner—David Lam

(57) ABSTRACT

A data storage device that includes a novel resistive cross point memory cell array and a method of making the data storage device are described. The resistive cross point memory cell array enables high-density fabrication and high-speed operation with isolation diodes that have practical dimensions and current density characteristics. In addition, the data storage device includes a novel equipotential isolation circuit that substantially avoids parasitic currents that otherwise might interfere with the sensing of the resistance state of the memory cells. In one aspect, the memory cells of the resistive cross point memory cell array are arranged into multiple groups of two or more memory cells. The memory cells of each group are connected between a respective word line and a common isolation diode that is coupled to a bit line.

21 Claims, 4 Drawing Sheets

HYBRID RESISTIVE CROSS POINT MEMORY CELL ARRAYS AND METHODS OF MAKING THE SAME

TECHNICAL FIELD

This invention relates to resistive cross point memory cell arrays and methods of making the same.

BACKGROUND

Many different resistive cross point memory cell arrays have been proposed, including resistive cross point memory cell arrays having magnetic random access memory (MRAM) elements, phase change memory elements, resistive polymer memory elements, polysilicon memory elements, and write-once (e.g., fuse based or anti-fuse based) resistive memory elements.

A typical MRAM storage device, for example, includes an array of memory cells. Word lines may extend along rows of the memory cells, and bit lines may extend along columns of the memory cells. Each memory cell is located at a cross point of a word line and a bit line. Each MRAM memory cell stores a bit of information as an orientation of a magnetization. In particular, the magnetization of each memory cell assumes one of two stable orientations at any given time. These two stable orientations, parallel and anti-parallel, represent logic values of 0 and 1. The magnetization orientation affects the resistance of a memory cell. For example, the resistance of a memory cell may be a first value, R, if the magnetization orientation is parallel, and the resistance of the memory cell may be increased to a second value, R+ΔR, if the magnetization orientation is changed from parallel to anti-parallel.

In general, the logic state of a resistive cross point memory cell may be read by sensing the resistance state of the selected memory cell. Sensing the resistance state of a single memory cell in the array, however, typically is difficult because all of the memory cells in a resistive cross point memory cell array are interconnected by many parallel paths. Thus, the resistance that is seen at one cross point equals the resistance of the memory cell at that cross point in parallel with resistances of memory cells in the other word lines and bit lines. In addition, if the target memory cell being sensed has a different resistance state due to stored magnetization, a small differential voltage may develop. This small differential voltage may give rise to parasitic or "sneak path" currents that may interfere with the sensing of the resistance state of the target memory cell.

Thus, one hurdle that must be overcome before high density and fast access resistive cross point memories may be developed is the reliable isolation of selected resistive cross point memory cells while data stored on a selected memory cell is being sensed. In general, prior techniques for isolating such memory cells fall into one of three memory cell isolation categories: select transistor isolation techniques; diode isolation techniques; and equipotential isolation techniques.

Select transistor isolation techniques typically involve inserting a select transistor in series with each resistive cross point memory cell. This architecture typically is characterized by fast read access times. Unfortunately, such a series transistor architecture typically also is characterized by relatively poor silicon area utilization because the area under the resistive cross point memory cell array typically is reserved for the series transistors and, therefore, is unavailable for support circuits. In addition, this isolation technique also tends to suffer from relatively poor memory cell layout density because area must be allocated in each memory cell for a via that connects the memory cell to the series transistor in the substrate. This isolation technique also generally requires relatively high write currents because an isolated write conductor must be added to the memory cell to provide a write circuit in parallel with a read circuit and the location of the write conductor results in high write currents to generate the required write fields. In general, this approach is limited to a single memory plane because the series transistors must be located in the substrate and there is no practical way to move the series transistors out of the substrate and into the memory cell plane.

Diode isolation techniques typically involve inserting a diode in series with each resistive cross point memory element. This memory cell array architecture may be implemented with thin film diodes that allow multi-level resistive cross point memory arrays to be constructed (see, e.g., U.S. Pat. No. 5,793,697). This architecture has potential for high-speed operation. The difficulty often associated with this architecture involves providing a suitable thin film diode with minimum process feature sizes matching the potential density of the memory cell arrays. In addition, this approach uses one diode per memory element and, at currently practical MRAM features and parameters, for example, each diode would be required to conduct 5 to 15 kA/cm$^2$. Such high current densities generally are impractical for implementing thin film diodes in high-density MRAM arrays.

Equipotential isolation techniques typically involve sensing resistive cross point memory cells without using series diodes or transistors (see, e.g., U.S. Pat. No. 6,259,644). This approach may be implemented by a cross point array of memory elements that is relatively simple to fabricate. This cross point memory cell array architecture typically has a density that is limited only by the minimum feature sizes of the implementing circuit technology and typically requires relatively low write currents. In addition, it is relatively simple to extend this approach to multi: level resistive cross point memory cell arrays to achieve very high-density memories. Equipotential isolation, however, often is difficult to implement in large arrays. Auto-calibration and triple sample read techniques have been used to sense data in large MRAM arrays using equipotential isolation techniques, but these sense processes typically limit the read sense time to a range of 5 μs to 20 μs.

SUMMARY

The invention features a data storage device that includes a novel resistive cross point memory cell array that enables high-density fabrication and high-speed operation with isolation diodes that have practical dimensions and current density characteristics. In addition, the inventive data storage device includes a novel equipotential isolation circuit that substantially avoids parasitic currents that otherwise might interfere with the sensing of the resistance state of the memory cells.

In one aspect, the invention features a data storage device that includes a resistive cross point array of memory cells, a plurality of word lines, and a plurality of bit lines. The memory cells are arranged into multiple groups of two or more memory cells. The memory cells of each group are connected between a respective word line and a common isolation diode that is coupled to a bit line.

Embodiments of the invention may include one or more of the following features.

Multiple read circuits preferably are each coupled to one or more associated groups of memory cells by a respective bit line. The read circuits preferably are operable to sense current flow through a memory cell of the associated groups. Each read circuit may include a differential amplifier. The differential amplifier may be a current mode differential amplifier. The differential amplifier preferably is operable to compare current flowing through a selected memory cell with current flowing through one or more reference cells. The data storage device may further comprise multiple comparator circuits each of which is coupled to an associated read circuit. The comparator circuits preferably are operable to convert an analog differential sense voltage to a digital output read signal.

The data storage device preferably comprises an equipotential generator that is coupled to the word lines and the bit lines. The equipotential generator preferably is operable to set voltage levels in the resistive cross point memory cell array to substantially prevent parasitic currents from flowing through unselected memory cells. The equipotential generator may be operable to set an input node of the common isolation diode of each group of memory cells and unselected word lines to a common array voltage. In some embodiments, the equipotential generator is operable to establish equipotential isolation of a selected word line based upon feedback from one or more unselected word lines. Unselected word lines in a selected group of word lines may be connected together to set an averaged feedback voltage that is approximately equal to an applied array voltage. In one embodiment, the input node of each isolation diode is coupled to a respective voltage follower transistor, and the equipotential generator is coupled to gates of the voltage follower transistors. The equipotential generator may comprise an operational amplifier circuit having a first input coupled to a reference voltage, a second input coupled to the word lines, and an output coupled to the gates of the voltage follower transistors. The second input of the operational amplifier circuit may be coupled to the word lines through a switching circuit.

In some embodiments, each memory cell may comprise a magnetic random access memory element.

In another aspect, the invention features a process of making a data storage device. In accordance with this inventive process, a resistive cross point array of memory cells is formed. A plurality of word lines and a plurality of bit lines also are formed. The memory cells are arranged into multiple groups of two or more memory cells. The memory cells of each group are connected between a respective word line and a common isolation diode that is coupled to a bit line.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
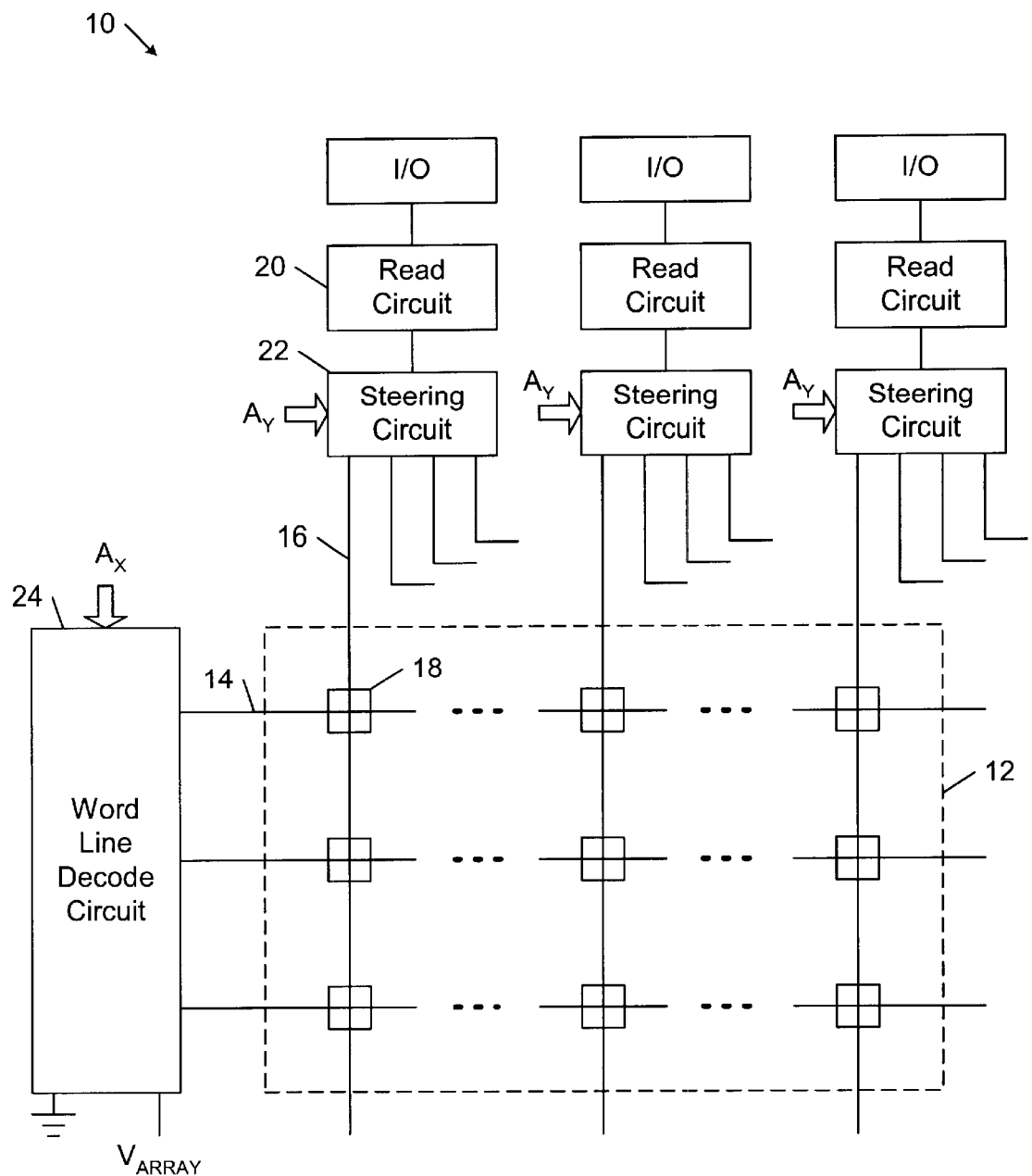
FIG. 1 is a circuit diagram of a data storage device that includes a resistive cross point array of memory cells, multiple read circuits and associated steering circuits, and a word line decode circuit.

Referring to FIG. 1, in one embodiment, a data storage device 10 includes a resistive cross point memory cell array 12, a plurality of word lines 14 that extend along rows of the cross point memory cell array 12, and plurality of bit lines 16 that extend along columns of the cross point memory cell array 12. The memory cells 18 of memory cell array 12 may be implemented as any one of a wide variety of conventional resistive memory elements, including magnetic random access memory (MRAM) elements, phase change memory elements, resistive polymer memory elements, polysilicon memory elements, and write-once (e.g., fuse based or antifuse based) resistive memory elements.

Data storage device 10 also includes multiple read circuits 20, each of which is coupled to one or more associated sets of memory cells 18 by a respective bit line 16. Each read circuit 20 is operable to sense current flow through a memory cell of the associated group (or groups) of memory cells 18. A steering circuit 22 selectively couples an associated read circuit 20 to a selected bit line 16 based upon a received bit line address ($A_y$). Each steering circuit 22 includes a set of switches that connects each bit line 16 to a source of a constant array voltage ($V_{ARRAY}$) or to an associated read circuit 20. A word line decode circuit 24 selectively activates a particular word line 14 based upon a received word line address ($A_x$). During read operations, word line decode circuit 24 may activate a selected word line 14 by applying selectively to each of word lines 14 either a constant array voltage ($V_{ARRAY}$) or a read potential. An output of each read circuit 20 is coupled to an input of a respective input/output (I/O) pad of data storage device 10.

In the illustrated embodiment, resistive cross point memory cell array is shown to have a relatively small number of memory cells 18. Other embodiments, however, may include a large number of memory cells. For example, in one embodiment, resistive cross point memory cell array 12 includes a 1024×1024 array of memory cells 18 and two hundred and fifty-six read circuits 20, each read circuit 20 fitting a pitch of four bit lines 16. In this embodiment, a total of four bit lines 16 may be multiplexed into each read circuit 20. Some embodiments may include multiple levels of memory cell arrays 12. In these embodiments, bit lines 16 from different levels may be multiplexed into the read circuits 12.

In some embodiments, data storage device 10 also may include a write circuit (not shown) for writing information into the memory cells 18 of resistive cross point memory array 12.

As explained in detail below, the architecture of resistive cross point memory cell array 12 enables high-density fabrication and high-speed operation with isolation is diodes that have practical dimensions and current density characteristics. In addition, data storage device 10 includes a novel equipotential isolation circuit that substantially avoids parasitic currents that otherwise might interfere with the sensing of the resistance state of the memory cells 18.

Figure 2:
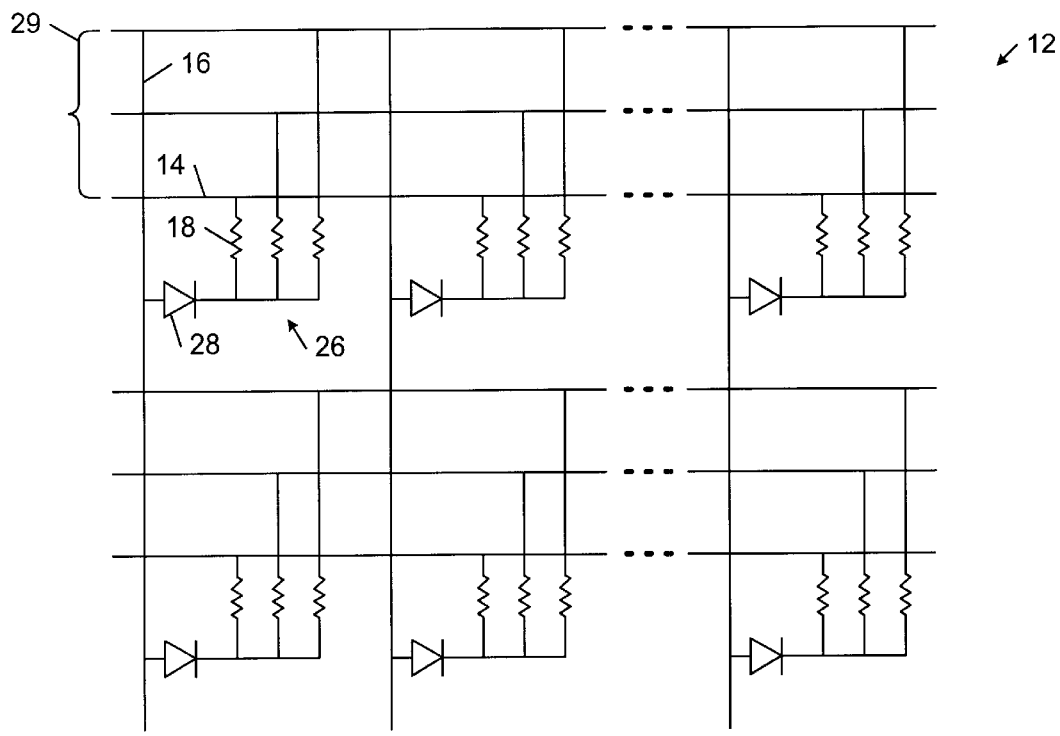
FIG. 2 is a circuit diagram of a portion of the resistive cross point memory cell array of FIG. 1, including multiple groups of three memory cells each connected between a respective word line and a common group isolation diode.

Referring to FIG. 2, in one embodiment, the memory cells 18 of resistive cross point memory cell array 12 are arranged into multiple groups 26 of two or more memory cells 18. For example, in the illustrated embodiment, each group 26 includes three memory cells 18. The memory cells 18 of each group 26 are connected between a respective word line 14 and a common group isolation diode 28, which is coupled to a bit line 16. Resistive cross point memory cell array 12 features the high-speed operational advantages associated with diode isolation architectures and the high-density advantages of equipotential isolation architectures in an architecture that may be implemented with isolation diodes that have practical dimensions and current density characteristics. In some embodiments, isolation diodes 28 may be fabricated with memory cells 18 using a conventional thin film diode fabrication technology, thereby allowing multi-level resistive cross point memory arrays to be constructed.

In operation, data is sensed in a target cell of resistive cross point memory cell array 12 by selecting a word line 14 corresponding to the target memory cell, and connecting it to a low potential (roughly the ground potential). At the same time, groups of bit lines 16 are connected to read circuits 20 in reference/sense pairs, as described in detail below in connection with FIG. 3A. An array potential ($V_{ARRAY}$) is applied to the unselected bit lines 16 from the output of an equipotential generator, which also is described in detail below. The equipotential generator applies a control voltage to the read circuits 20 coupled to the selected bit lines to set bit line voltages so that the voltage that is applied to the selected memory elements is equal to the array potential ($V_{ARRAY}$). The equipotential generator also applies a control voltage to the steering circuits 22 coupled to the unselected bit lines to set the unselected bit line voltages so that the voltage that is applied to the unselected memory elements is equal to the array potential ($V_{ARRAY}$). Unselected word lines 14 in a selected group 29 of word lines 14 are connected together and form an averaged feedback voltage as a second input to the equipotential generator. The equipotential generator develops an output voltage ($V_G$) from the difference of the applied array voltage ($V_{ARRAY}$) and the feedback voltage to the source follower transistors 44 to achieve a voltage equal to $V_{ARRAY}$ applied to the selected reference resistor 36, the selected memory resistor 38 and the unselected memory resistors 39 connected to the selected word line. In this way, the memory elements connected to the selected word line have approximately $V_{ARRAY}$ applied across them and all of the other, unselected memory elements that are associated with the selected bit lines 16 and the selected group 29 of word lines 14 have approximately zero potential across them. As a result, the bit line read circuits 20 receive sense currents only from the selected memory elements. The unselected groups of word lines 14 are connected to a high potential (on the order of twice the magnitude of the voltage drop of isolation diodes 28) and are isolated from the associated bit lines 14 by the reverse biased isolation diodes 28. The unselected bit lines 16 have a voltage ($V_G$) applied to them so that $V_{ARRAY}$ is applied across the associated memory elements and the associated isolation diodes 28. Consequently, a parasitic bit line current flows in the unselected bit lines during a read operation.

Figure 3B:
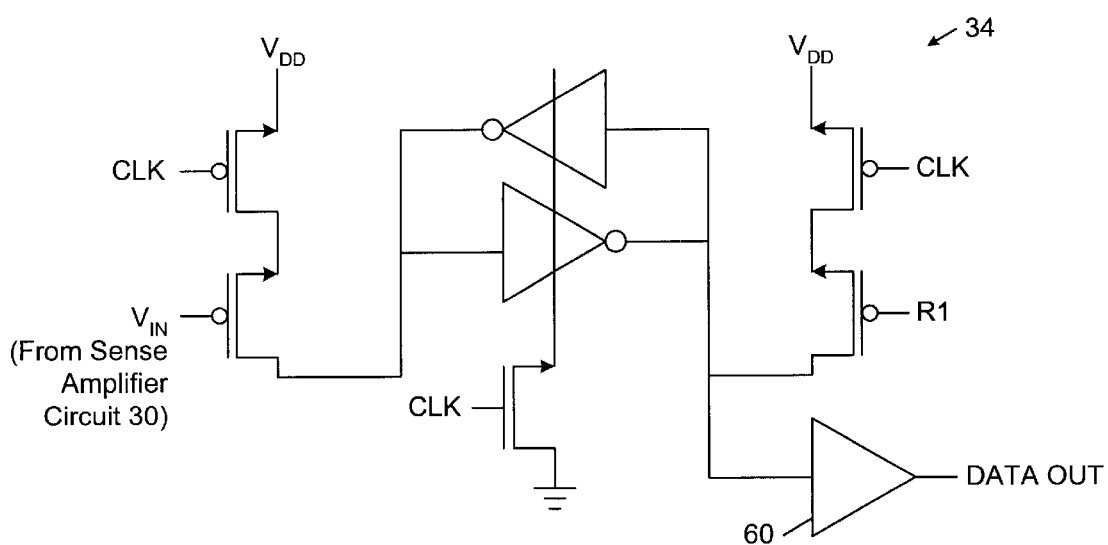
FIG. 3B is a circuit diagram of a comparator circuit that is operable to convert an analog differential sense voltage that is generated by the read circuit of FIG. 3A into a digital output read signal.
Figure 3A:
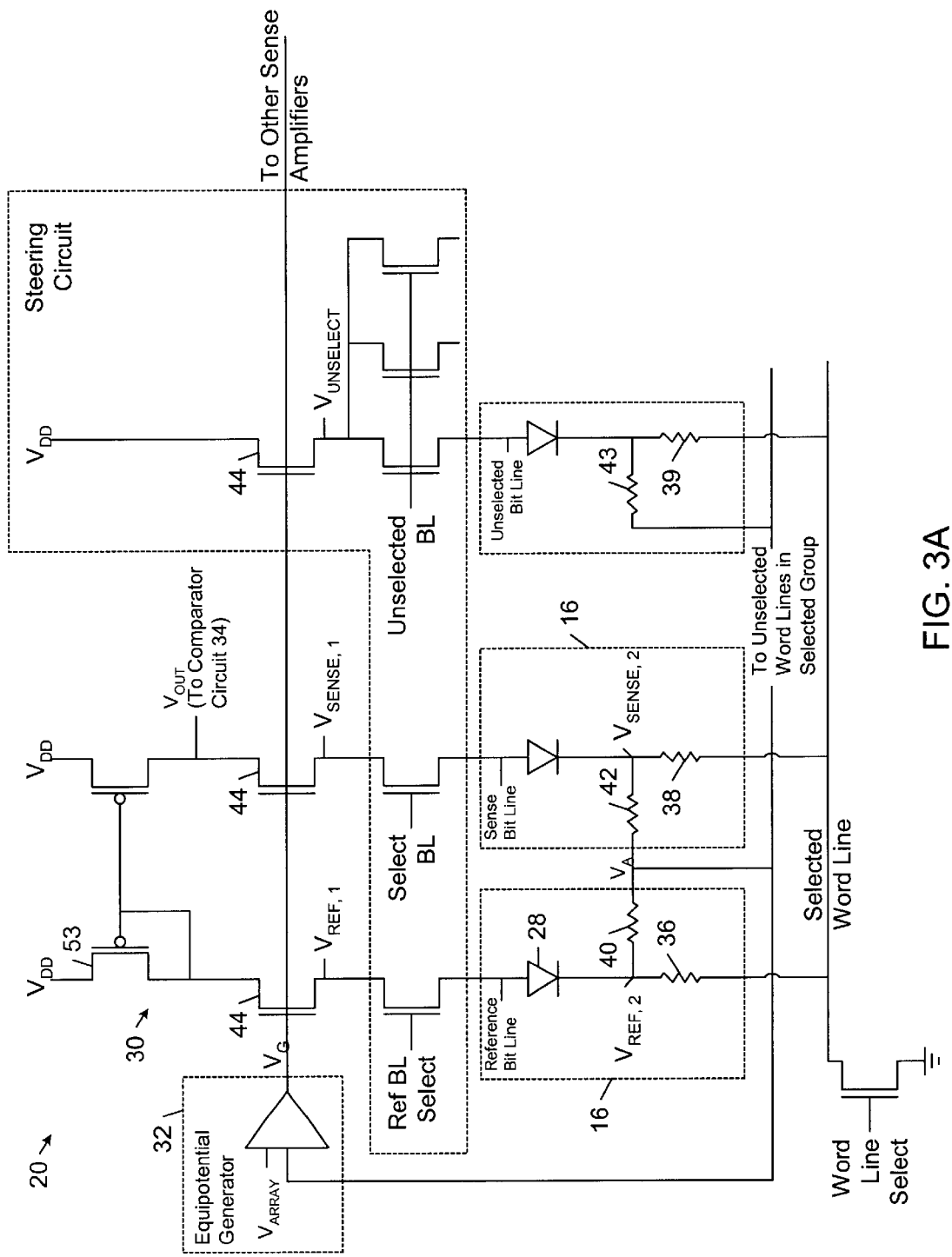
FIG. 3A is a circuit diagram of a sense amplifier circuit that is operable to sense current flow through a memory cell of one or more associated groups of memory cells, and an equipotential generator that is operable to set voltage levels in the resistive cross point memory cell array of FIG. 1 to substantially prevent parasitic currents from flowing through unselected memory cells.

As shown in FIGS. 3A and 3B, in one embodiment, each read circuit 20 includes a sense amplifier circuit 30, an equipotential generator circuit 32, and a comparator circuit 34. Sense amplifier 30 may be implemented as a current mode differential amplifier. In the embodiment of FIG. 3A, two bit lines 16 of the memory cell array are shown: a reference bit line and a sense bit line. The reference bit line and the sense bit line are shown in equivalent circuit form having, respectively, a target reference cell element 36 and a target sense cell element 38; the other cells are represented by resistors 40, 42. In operation, data '1' or data '0' may be sensed by detecting the difference between a current that is generated in the reference bit line and a current that is generated in the sense bit line. In some embodiments, there may be several memory cells associated with a reference bit line. In other embodiments, there may be one reference bit line per bit.

During a read operation, the equipotential generator develops a gate voltage signal ($V_C$) that is applied to a set of voltage follower transistors 44, one in each selected bit line. Each of the voltage follower transistors 44 sets a respective bit line voltage (e.g., $V_{REF,1}$ and $V_{SENSE,1}$) to a narrow voltage range while providing a high impedance to the sense nodes in sense amplifier circuit 30. Sense currents that flow through the voltage follower transistors 44 pass through the group isolation diodes 28 and then through the selected memory elements 36, 38. The voltage level $V_G$ preferably is set so that the voltages, $V_{REF,2}$ and $V_{SENSE,2}$ which are applied across the memory elements 36, 38, are very close to the array voltage, $V_{ARRAY}$. If the voltages $V_{REF,2}$ and $V_{SENSE,2}$ are equal to $V_{ARRAY}$, no parasitic current will flow through the sneak path memory elements 40, 42, as explained above. A similar action occurs for the unselected bit lines, the output of the equipotential generator ($V_G$) applies a gate voltage to a source follower associated with the unselected bit lines to apply an voltage approximately equal to $V_{ARRAY}$ to the unselected memory cells 39 so that no parasitic sneak path currents will flow associated sneak path memory cells 43, In this embodiment, all the unselected word lines in a group 26 are coupled together at node A and develop an averaged voltage $V_A$ to form the feedback voltage as the second input to the equipotential generator circuit 32. Connecting the unselected word lines together forms a voltage divider circuit that samples the voltages applied to the selected memory cells. These voltages are approximately equal, and the output of the unselected memory element voltage divider will represent an average of the slightly different voltages applied to the selected memory cells. In one embodiment, equipotential generator circuit 32 is implemented as an operational amplifier control circuit having a first input coupled to a source of $V_{ARRAY}$, a second input coupled to the unselected word lines 14 ($V_A$) through row select decode circuits (not shown in FIG. 3A), and an output coupled to the gates of voltage follower transistors 44. The constant array voltage may be provided by an external circuit (not shown). When $V_A$ is equal to $V_{ARRAY}$, $V_G$ is set so that $V_{REF,2}$, and $V_{SENSE,2}$, and $V_A$ all have approximately the same magnitude so that an insubstantial current will flow across node A. This technique also works well when multiple sense amplifiers are used (i.e., when multiple bit pairs are sensed at the same time).

Current mirror sense amplifier circuit 30 operates similarly to the operation of known current mirror circuits (see, e.g., U.S. Pat. No. 6,256,247 and U.S. Pat. application No. 2001/0012228). This circuit is capable of developing a large sense voltage signal ($V_{OUT}$) from two nearly equal sense currents.

As shown in FIG. 3B, comparator circuit 34 may be implemented as a clocked comparator/latch. This circuit operates similarly to the operation of known clocked comparator/latch circuits for converting an analog differential sense voltage data to reliable full swing digital data. When combined with the other components of data storage device 10, comparator/latch circuit 34 is a reliable and efficient circuit for completing the sense operation.

Figure 4:
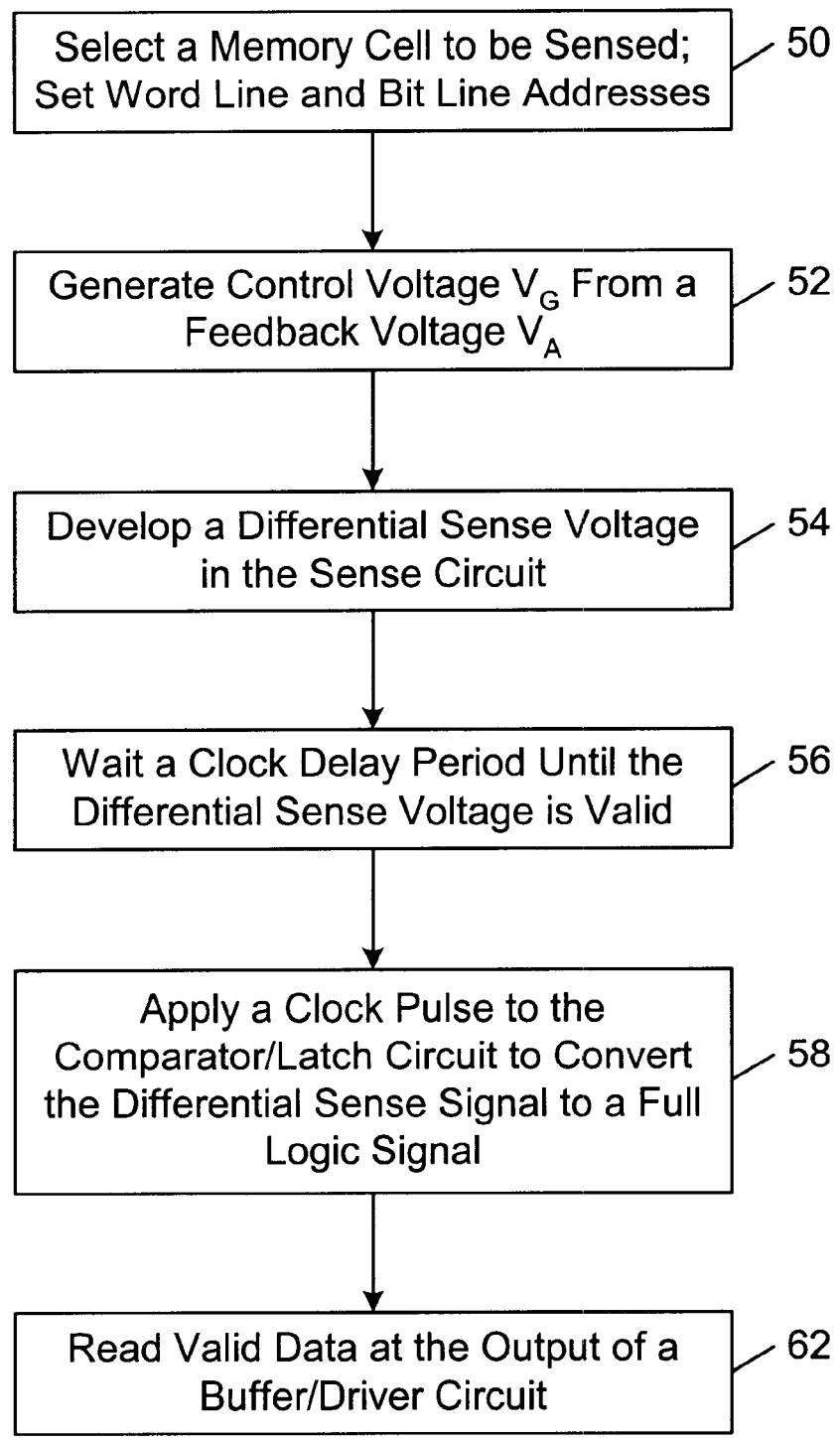
FIG. 4 is a flow diagram of a method of reading a memory cell of the resistive cross point memory cell array of FIG. 1.

Referring to FIG. 4, in one embodiment, a memory cell 18 of the resistive cross point memory cell array 12 may be read as follows. Initially, a memory cell to be sensed is selected by setting the word line and bit line addresses ($A_X$ and $A_Y$) to the addresses of the selected memory cell and the selected reference cell (step 50). If there is a reference bit line and a sense bit line for every bit, the two bit lines may be referred to as a "bit"—"bit-bar" bit line pair. One word line 14 may be selected by first selecting a word line group 29 and then selecting one word line 14 from within the word line group 29. The selected memory cell to be sensed is located at the intersection of the selected word line 14 and the selected bit lines 16. Next, a control voltage $V_G$ is generated in equipotential generator 32 to establish an operation condition that imposes equipotential isolation within the set of memory cells 18 on a selected word line 16 (step 52). The control voltage $V_G$ maximizes the sense current flowing through the selected memory element and substantially prevents current flow through the sneak path elements. Sense currents flow through the current mirror sense amplifier circuit 30. The sense current in the reference bit line establishes a mirror voltage on the gate of the mirror transistor 53 (FIG. 3A) (step 54). If the sense current in the sense bit line is greater than the reference sense current, the output node voltage ($V_{OUT}$) will fall below the reference node voltage $V_{REF,1}$, to indicate one logic state. Alternatively, if the sense current in the sense bit line is less than the reference sense current, the output node voltage ($V_{OUT}$) will rise above the reference node voltage $V_{REF,1}$ to indicate the other logic state. A delay period is externally set to allow valid data to develop in the current mirror sense amplifier circuit 30 (step 56). After an appropriate delay period, the analog current sense circuit voltages are connected to the comparator/latch circuit 34. The comparator/latch circuit 34 generates a full logic signal from a small analog differential signal when the clock signal (CLK) is high (step 58) and an output is extracted from the comparator/latch circuit 34 through a buffer amplifier 60 (FIG. 3B) (step 62).

Other embodiments are within the scope of the claims.

What is claimed is:

1. A data storage device, comprising:
   a resistive cross point array of memory cells;
   a plurality of word lines; and
   a plurality of bit lines;
   wherein memory cells are arranged into multiple groups of two or more memory cells, the memory cells of each group being connected between a respective word line and a common isolation diode coupled to a bit line.

2. The data storage device of claim 1, further comprising multiple read circuits each coupled to one or more associated groups of memory cells by a respective bit line and operable to sense current flow through a memory cell of the associated groups.

3. The data storage device of claim 2, wherein each read circuit comprises a differential amplifier.

4. The data storage device of claim 3, wherein the differential amplifier is a current mode differential amplifier.

5. The data storage device of claim 4, wherein the differential amplifier is operable to compare current flowing through a selected memory cell with current flowing through one or more reference cells.

6. The data storage device of claim 4, further comprising multiple comparator circuits each coupled to an associated read circuit and operable to convert an analog differential sense voltage to a digital output read signal.

7. The data storage device of claim 1, further comprising an equipotential generator coupled to the word lines and the bit lines and operable to set voltage levels in the resistive cross point memory cell array to substantially prevent parasitic currents from flowing through unselected memory cells.

8. The data storage device of claim 7, wherein the equipotential generator is operable to set an input node of the common isolation diode of each group of memory cells with feedback from unselected word lines.

9. The data storage device of claim 8, wherein unselected word lines in a selected group of word lines are connected together to set an averaged feedback voltage that is approximately equal to an applied array voltage.

10. The data storage device of claim 9, wherein the equipotential generator is operable to establish equipotential isolation of a selected word line based upon feedback from one or more unselected word lines.

11. The data storage device of claim 9, wherein the input node of each isolation diode is coupled to a respective voltage follower transistor and the equipotential generator is coupled to gates of the voltage follower transistors.

12. The data storage device of claim 11, wherein the equipotential generator comprises an operational amplifier circuit having a first input coupled to a reference voltage, a second input coupled to the unselected word lines, and an output coupled to the gates of the voltage follower transistors.

13. The data storage device of claim 12, wherein the second input of the operational amplifier circuit is coupled to the unselected word lines through a switching circuit.

14. The data storage device of claim 1, wherein each memory cell comprises a magnetic random access memory element.

15. A process of making a data storage device, comprising:
   forming a resistive cross point array of memory cells;
   forming a plurality of word lines; and
   forming a plurality of bit lines;
   wherein memory cells are arranged into multiple groups of two or more memory cells, the memory cells of each group being connected between a respective word line and a common isolation diode coupled to a bit line.

16. The process of claim 15, further comprising forming multiple read circuits each coupled to one or more associated groups of memory cells by a respective bit line and operable to sense current flow through a memory cell of the associated groups.

17. The process of claim 16, wherein each read circuit comprises a differential amplifier.

18. The process of claim 17, wherein the differential amplifier is operable to compare current flowing through a selected memory cell with current flowing through one or more reference cells.

19. The process of claim 15, further comprising forming an equipotential generator coupled to the word lines and the bit lines and operable to set voltage levels in the resistive cross point memory cell array to substantially prevent para sitic currents from flowing through unselected memory cells.

20. The process of claim 19, wherein the equipotential generator is operable to set an input node of the common isolation diode of each group of memory cells from feedback from unselected word lines representing a common array voltage.

21. The process of claim 20, wherein the input node of each isolation diode is coupled to a respective voltage follower transistor, and the equipotential generator is coupled to gates of the voltage follower transistors.

\* \* \* \* \*